United States Patent
Ishikawa et al.

(10) Patent No.: US 6,284,382 B1
(45) Date of Patent: Sep. 4, 2001

(54) ANTIREFLECTION FILM AND MANUFACTURING METHOD THEREOF

(75) Inventors: Hiroichi Ishikawa; Barret Lippey, both of Kanagawa; Tomio Kobayashi, Miyagi; Yoshihiro Oshima, Gifu; Shinobu Mitsuhashi, Kanagawa; Masataka Yamashita, Gifu; Yoshiharu Honjo, Kanagawa; Koichi Kaneko, Gifu, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/200,149

(22) Filed: Nov. 25, 1998

(30) Foreign Application Priority Data

Nov. 27, 1997 (JP) .................................. 09-325617
Aug. 14, 1998 (JP) .................................. 10-229560

(51) Int. Cl.⁷ .............................. B32B 9/00; B32B 17/04
(52) U.S. Cl. .................... 428/428; 359/360; 359/580; 359/586; 359/588; 359/589; 428/212; 428/216; 428/336; 428/343; 428/344; 428/428; 428/697; 428/699; 428/701; 428/702
(58) Field of Search ...................... 359/359, 360, 359/580, 586, 588, 589; 428/212, 216, 336, 343, 344, 428, 697, 699, 701, 702

(56) References Cited

U.S. PATENT DOCUMENTS 5,362,552 * 11/1994 Austin ................................. 428/216
5,972,517 * 10/1999 Kondo et al. ........................ 428/446

* cited by examiner

Primary Examiner—Deborah Jones
Assistant Examiner—Lymarie Miranda
(74) Attorney, Agent, or Firm—Ronald P. Kananen; Rader, Fishman & Grauer

(57) ABSTRACT

Disclosed is an antireflection film used to be stuck on the surface of a glass panel of a CRT, which can be inexpensively manufactured at a high productivity while satisfying all of requirements regarding its adhesive strength, reflectance characteristic, electric resistance and total light transmittance. The antireflection film is formed by stacking silicon oxide films and indium tin oxide films on a base film in multilevels, wherein the thickness of the uppermost silicon oxide film of the antireflection film is thicker than the indium tin oxide film directly under the uppermost silicon oxide film, and the lowermost silicon oxide film, positioned at the interface with the base film, of the antireflection film is a $SiO_x$ film where the value x is in a range of 0.5 to 1.9.

11 Claims, 4 Drawing Sheets

ANTIREFLECTION FILM AND MANUFACTURING METHOD THEREOF

BACKGROUND OF THE INVENTION

The present invention relates to an antireflection film and a manufacturing method thereof, and particularly to an antireflection film formed by stacking silicon oxide films and indium tin oxide films in multilevels, and a manufacturing method thereof.

In general, an antireflection film of a stacked structure having conductive films has been formed by alternately stacking, on a base film, films each having a larger refractive index and films each having a small refractive index. In many cases, the film having a small refractive index has been made from silicon dioxide (hereinafter, referred to as "$SiO_2$") and the film having a larger refractive index and an electric conductivity has been made from indium tin oxide (hereinafter, referred to as "ITO"). For example, there has been known an antireflection film formed by stacking, on a resin base film, an ITO film, a $SiO_2$ film, an ITO film, a $SiO_2$ film, and a contamination preventive film in this order.

However, the antireflection film used to be stuck on the surface of a glass panel of a CRT (Cathode Ray Tube), for example, a Braun tube, is required to satisfy the following characteristics:

(1) The adhesive strength to a resin base film must be sufficient large. In this case, the adhesive strength is measured for the antireflection film after being left for two hours in an atmosphere in a high temperature (for example, 60° C.) and a high humidity (98%) or after being repeatedly subjected to five cycles of heat history between +70° C. (five hours) and −40° C. (five hours).

(2) The reflectance characteristic (average reflectance to light having a wavelength of 450 nm to 650 nm) must be as sufficiently small as 0.6% or less.

(3) The electric resistance (to ensure electromagnetic shielding and antistatic characteristic) must be 500 $\Omega/\square$ or less.

(4) The transparency must be large. More specifically, the total light transmittance (to light having a wavelength of 450 nm to 650 nm) must be 90% or more.

In summary, the antireflection film used for a glass panel of a CRT is required to simultaneously satisfy the above inconsistent characteristics (1) to (4).

The above-described related art antireflection film having the stacked structure of $ITO/SiO_2/ITO/SiO_2$ is generally difficult to simultaneously satisfy the items (1) to (4). To be more specific, the related art antireflection film allowing to satisfy them can be manufactured at the expense of the manufacturing yield, which results in the increased manufacturing cost.

SUMMARY OF THE INVENTION

An object of the present invention is to provide an antireflection film which is stuck on the surface of a glass panel of a CRT, and which can be inexpensively manufactured at a high productivity while satisfying all of requirements regarding its adhesive strength, reflectance characteristic, electric resistance and total light transmittance, and to provide a manufacturing method thereof.

To achieve the above object, according to a first aspect of the present invention, there is provided an antireflection film including: silicon oxide films and indium tin oxide films stacked on a base film in multilevels, wherein the thickness of the uppermost silicon oxide film of the antireflection film is thicker than that of the indium tin oxide film directly under the uppermost silicon oxide film. In the above antireflection film, preferably, the lowermost silicon oxide film, positioned at the interface with the base film, of the antireflection film is a $SiO_x$ film where the value x is in a range of 0.5 to 1.9.

In the above antireflection film, since the thickness of the uppermost silicon oxide film is thicker than that of the indium tin oxide film directly under the silicon oxide film, light absorption of the indium tin oxide film becomes small, so that a reduction in total light transmittance becomes small. As a result, it becomes easy for the antireflection film to ensure the total light transmittance capable of satisfying an allowable value (for example, 90% or more). Also since the $SiO_x$ film is provided as the lowermost film, positioned at the interface with the base film, of the antireflection film and the value x of the $SiO_x$ film is specified to be in a range of 0.5 to 1.9, it is possible to suppress a reduction in total light transmittance in a range of about 0.5% to 2.5% while ensuring a sufficient adhesive strength of the antireflection film.

According to a second aspect of the present invention, there is provided a method of manufacturing an antireflection film, including the step of: stacking silicon oxide films and indium tin oxide films on a base film in multilevels, wherein the thickness of the uppermost silicon oxide film of the antireflection film is thicker than the indium tin oxide film directly under the uppermost silicon oxide film. The above method preferably further includes the step of forming the lowermost silicon oxide film of the antireflection film while controlling the degree of oxidation of silicon by measuring light absorption of the silicon oxide film. Also the above method preferably further includes the step of allowing, before formation of the lowermost silicon oxide film, the surface of the base film on which the lowermost silicon oxide film is to be formed to undergo surface activation treatment due to glow discharge using an aluminum electrode. In the method, preferably, the films constituting the antireflection film are formed using a dual magnetron type sputtering system.

In the above manufacturing method, since the silicon oxide ($SiO_x$) film is formed while the degree of the oxidation of silicon is controlled by measuring light absorption of the silicon oxide film, it is possible to ensure a sufficient adhesive strength to the base film and also keep the total light transmittance of the antireflection film at a specific value or more. Also since before formation of the $SiO_x$ film, the surface of the base film on which the $SiO_x$ film is to be formed is subjected to glow discharge treatment using an aluminum electrode, it is possible to enhance the adhesive strength of the antireflection film to the base film. Further, since the films constituting the antireflection film are formed using a dual magnetron type sputtering system, each film thus formed is of a multilayer structure in which thin layers each containing oxygen in a large amount and thin layers each containing oxygen in a small amount are stacked densely in multilayers. As compared with a multilayer structure in which layers each containing oxygen in a large amount and layers each containing oxygen in a small amount are coarsely stacked in multilayers or a multilayer structure having layers each containing oxygen in the same amount, the above multilayer structure according to the present invention is advantageous in that stress is easily dispersed and propagation of breakage is obstructed by the interface of each layer, with a result that the film having such a multilayer structure is less susceptible to breakage. On the other hand, in the multilayer structure in which the layers are coarsely stacked or where the layers each contain the same amount of oxygen, since stress is less dispersed, the film, as a result, is susceptible to breakage.

Accordingly, since the antireflection film of the present invention can satisfy all of requirements regarding its adhesive strength, reflectance characteristic, electric resistance, and total light transmittance, it contributes to manufacture of a high quality CRT.

Further, according to the present invention, the antireflection film capable of satisfying all of requirements regarding its adhesive strength, reflectance characteristic, electric resistance, and total light transmittance can be manufactured at a high yield as compared with a related art method. This contributes to manufacture of a high quality CRT at a low cost.

DETAILED DESCRIPTION OF THE PREFERRED EMBODIMENT

Hereinafter, one embodiment of the present invention will be described with reference to the accompanying drawings.

Figure 1:
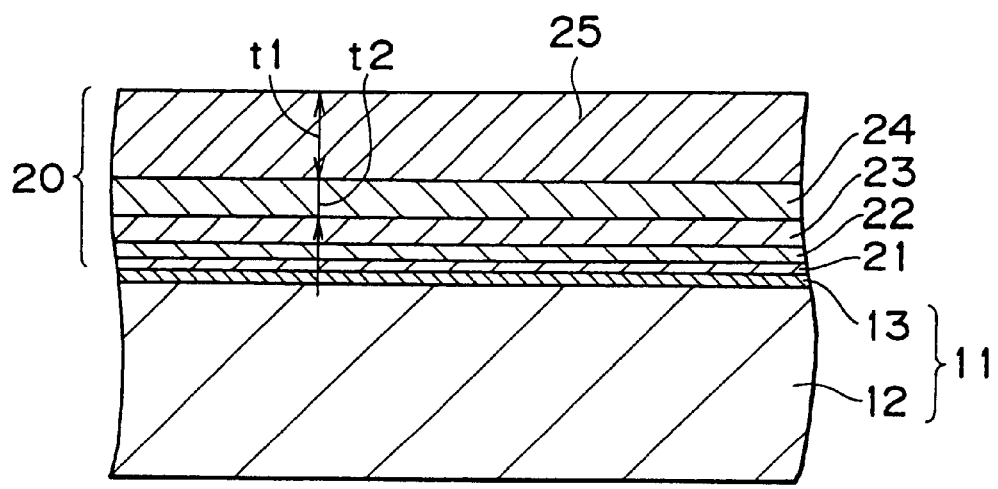
FIG. 1 is a sectional view showing essential portions of an antireflection film according to an embodiment of the present invention.

FIG. 1 is a sectional view showing essential portions of an antireflection film according to one embodiment of the present invention. As shown in FIG. 1, a base film 11 is prepared, which film is configured by forming a 5 μm thick hard coat film 13 on a 188 μm thick PET film 12. The hard coat film 13 is typically made from a polymethyl methacrylate (hereinafter, referred to as "PMM") based material. On the hard coat film 13 are stacked a silicon oxide ($SiO_x$) film 21, an indium tin oxide (ITO) film 22, a silicon oxide ($SiO_2$) film 23, an indium tin oxide (ITO) film 24, and a silicon oxide ($SiO_2$) film 25 in this order. These films constitute an antireflection film 20. In the following, each of the films 21, 22, 23, 24 and 25 is referred to by the abbreviation indicated in the parenthesis. In the above film configuration, the thickness t1 of the uppermost $SiO_2$ film 25 is specified to be thicker than the thickness t2 of the ITO film 24 directly under the $SiO_2$ film 25; and the value x of the Sio film 21 is specified to be in a range of 0.5 to 1.9.

In this way, the antireflection film 20 is formed by stacking the silicon oxide films and indium tin oxide films in multilevels. In the antireflection film 20, the thickness of each film is set, for example, as follows: 3 nm±2 nm for the $SiO_x$ film 21; 21 nm±3 nm for the ITO film 22; 32 nm±3 nm for the $SiO_2$ film 23; 42 nm±3 nm for the ITO film 24; and 103 nm±3 nm for the $SiO_2$ film 25. It should be noted that the thicknesses of the films described above can be suitably changed insofar as they satisfy the above two requirements regarding the thicknesses t1 and t2 of the $SiO_2$ film 25 and the ITO film 24 and the range of the value x of the $SiO_x$ film 21.

The surface of the uppermost $SiO_2$ film 25 may be coated with a contamination preventive film which is made from, for example, an alkoxysilane compound having a perfluoropolyether group.

Next, while not illustrated, there will be described a configuration of a related art antireflection film as a comparative example. In this film configuration, the thickness of the uppermost $SiO_2$ film is thinner than that of the ITO film directly under the $SiO_2$ film. In general, to obtain a reflectance of 0.6% or less by optical simulation, the related art antireflection film is configured by stacking, on a base film, a $SiO_x$ film (thickness: 5 nm±2 nm), an ITO film (15 nm±4 nm), an $SiO_2$ film (20 nm±4 nm), an ITO film (98 nm±7 nm), and $SiO_2$ film (85 nm±3 nm) in this order.

In the antireflection film 20 of an embodiment of the present invention, since the thickness of the ITO film 24 directly under the uppermost $SiO_2$ film 25 is one-half or less than that of the ITO film of the comparative example, light absorption of the ITO film 24 is smaller than that of the ITO film of the comparative example, and correspondingly a reduction in total light transmittance becomes smaller. As a result, the condition of forming the $SiO_x$ film 21 while satisfying the standard of the total light transmittance (for example, 90% or more) is made variable in a wide range. Further, since the $SiO_x$ film 21 is provided as the lowermost film, positioned at the interface with the base film 11, of the antireflection film 20 and the value x of the $SiO_x$ film 21 is specified to be in the range of 0.5 to 1.9, it is possible to keep a reduction in total light transmittance at a value in the range of about 0.5% to 2.5% while ensuring a sufficient adhesive strength of the antireflection film 20. If the value x of the $SiO_x$ film 21 is out of the above range, there occur problems that the adhesive strength of the antireflection film 20 is made poor, the total light transmittance is excessively reduced, and the like. Additionally, in the antireflection film 20 of the embodiment, although the ITO film 24 is thinly formed, the electric resistance of the antireflection film 20 is as small as 500 Ω/□ or less.

On the other hand, in the film configuration of the comparative example, since the thickness of the ITO film directly under the uppermost $SiO_2$ film is thicker than that of the uppermost $SiO_2$ film, a reduction in total light transmittance due to light absorption of the ITO film becomes larger, and accordingly, a light absorption amount of the $SiO_x$ film allowable in manufacture becomes excessively small. This causes poor productivity and poor yield of the antireflection film, resulting in the increased cost thereof.

To keep light absorption of the $SiO_x$ film 21 of the antireflection film 20 of the embodiment in a specific range, the $SiO_x$ film 21 is formed by reactive sputtering using a silicon target in an atmosphere of a mixed gas of oxygen gas ($O_2$) and argon gas (Ar). At this time, the amount of oxygen gas in the gas atmosphere is not determined only by the supplied amount of oxygen gas but it largely varies depending on a gas released from the inner wall of a sputtering chamber and a gas discharged from a rolled PET film. In particular, an oxygen ($O_2$) component produced from moisture ($H_2O$) discharged from the surface and the interior of the PET film 12 of the base film 11 tends to vary, and also an oxygen ($O_2$) component produced from moisture ($H_2O$) absorbed in the rolled PET film during manufacture thereof and during storage thereof until the rolled PET film is used for film formation by sputtering tends to vary, and consequently, a variation in light absorption of the antireflection film 20 by the presence of the $SiO_x$ film 21 is liable to occur upon formation of the $SiO_x$ film 21.

In view of the foregoing, the film configuration in which light absorption of the ITO film 24 is one-half or less as compared with the related art film configuration. That is, the thickness t1 of the uppermost $SiO_2$ film 25 is thicker than the thickness t2 of the ITO film directly under the $SiO_2$ film 25, and excellently reduces the variable effects of moisture, released from the rolled PET film, exerted on formation of the $SiO_x$ film 21. In the film configuration of the embodiment, the allowable thickness of each of the intermediate films, $SiO_2$ film 23 and ITO films 22 and 24, is wider than that in the comparative example, so that the film configuration of the embodiment is superior to that of the comparative example in terms of easy control of light absorption.

As described above, the antireflection film 20 can be manufactured at a high yield while satisfying all of the requirements regarding its adhesive strength, reflectance characteristic, electric resistance, and total light transmittance by specifying the thickness t1 of the uppermost $SiO_2$ film 25 to be thicker than the thickness t2 of the ITO film 24 directly under the $SiO_2$ film 25 and also specifying the value x of the $SiO_x$ film 21 to be in the range of 0.5 to 1.9.

Hereinafter, a method of manufacturing the above antireflection film 20 will be described. First, an antireflection film 20 is formed, by sputtering, on a base film 11 composed of a PET film 12 made from a PET based material on which a hard coat film 13 made from a PMM based material is formed. At this time, a $SiO_x$ film 21 as the first film is formed while the degree of oxidation of the $SiO_x$ film 21 is controlled by measuring the light absorption characteristic thereof. The degree of oxidation of the $SiO_x$ film 21 is set such that the value x of the $SiO_x$ film 21 is in a range of 0.5 to 1.9.

Upon formation of an antireflection film on the surface of a plastic lens made from an acrylic resin, a $SiO_x$ film ma be interposed between the antireflection film and the plastic lens for increasing the adhesive strength of the antireflection film to the plastic lens. In this regard, by determining the formation condition of the $SiO_x$ film 21 while measuring light absorption of the $SiO_x$ film 21, the $SiO_x$ film 21 allows the antireflection film 20 to keep the total light transmittance capable of satisfying the standard while ensuring a sufficient adhesive strength.

For example, in manufacture of the antireflection film 20 having the total light transmittance of 90% or more, by keeping a reduction in total light transmittance due to the $SiO_x$ film 21 in a range of about 0.5% to 2.5%, the $SiO_x$ film 21 allows the antireflection film 20 to satisfy the reflectance characteristic while sufficiently ensuring the adhesive strength. Here, the value x of the $SiO_x$ film 21 must be kept in the range of 0.5 to 1.9 as described above.

Figure 2:
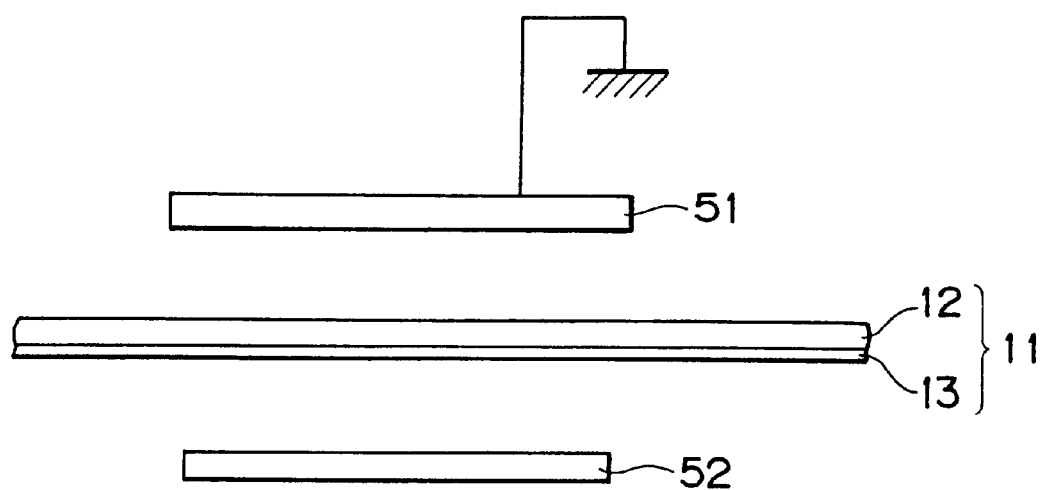
FIG. 2 is a view illustrating a surface activation treatment.

Next, there will be described, with reference to FIG. 2, a method of enhancing the reliability of the antireflection film 20 of the embodiment having the lowermost $SiO_x$ film 21 by further increasing the adhesive strength thereof to the base film 11 composed of the PET film 12 on which the hard coat film 13 is formed. As shown in FIG. 2, an earth electrode 51 is arranged on the side of the PET film 12 of the base film 11 and an electrode 52 for applying a minus dc voltage is arranged on the side of the hard coat 13 of the base film 11. And, before formation of the $SiO_x$ film, the surface of the hard coat film 13 is subjected to surface activation treatment by applying a minus dc voltage between both the electrodes 51 and 52 to generate a glow discharge therebetween. At this time, as a feature of the embodiment, an electrode made from an aluminum material is used as the electrode 52.

As a comparative example, the hard coat film 13 is subjected to surface activation treatment using an electrode made from iron, copper or brass as the electrode 52. The result shows that the surface activation treatment using the aluminum electrode is excellent in terms of enhancement of the adhesive strength of the antireflection film 20.

Figure 3A:
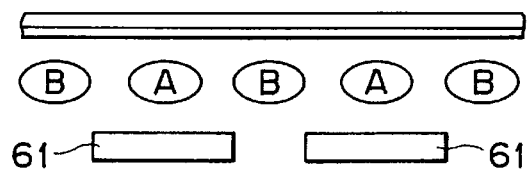
FIGS. 3A and 3B are views illustrating dual magnetron type sputtering and single magnetron type sputtering, respectively.

Upon formation of the antireflection film 20 by sputtering, there may be adopted a dual magnetron type sputtering process. This makes it possible to form each film having a dense, fine structure, and hence to increase the strength of the antireflection film as a whole. FIG. 3A is a view illustrating dual magnetron type sputtering, and FIG. 4A is a sectional view showing essential portions of a film formed by dual magnetron type sputtering; and FIG. 3B is a view illustrating single magnetron type sputtering, and FIG. 4B is a sectional view showing essential portions of a film formed by single magnetron type sputtering.

As shown in FIG. 3A, in the case of forming a $SiO_2$ film by dual magnetron type sputtering, silicon targets are used as targets 61 and a mixed gas of argon gas and oxygen gas is used as a sputtering atmosphere, and sputtering is carried out by applying an alternating current between the targets 61 in the sputtering atmosphere. At this time, a region A directly over each target 61 is less exposed to a new unreacted gas as compared with a region B separated from the target 61. That is to say, a gas flowing to the region A is a residue of the gas having already reacted somewhat in the region B. To be more specific, in the case of forming the $SiO_2$ film using oxygen gas as a reactive gas, the region A is exposed to a gas atmosphere containing oxygen in a small amount. As a result, the silicon oxide film formed on the base film 11 using such a dual magnetron type sputtering system (of a type with an ac voltage at 40 kHz applied between two targets) exhibits a layer configuration shown in FIG. 4A, in which two layers 71 each containing oxygen in a small amount and three layers 72 each containing oxygen in a large amount are alternately stacked. It should be noted that the more the number of the targets, the more the number of the layers 71 and 72.

Figure 3B:
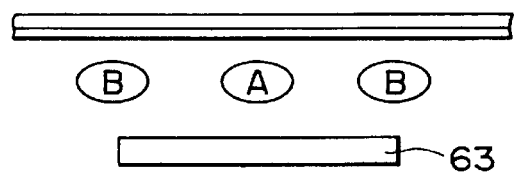
Figure 4A:
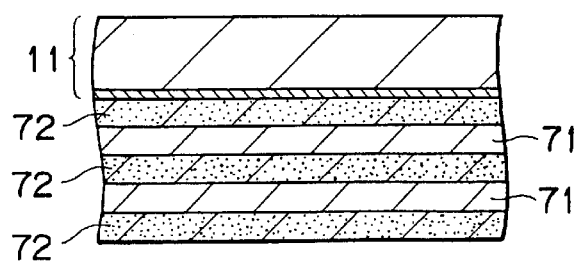
FIGS. 4A and 4B are sectional views showing essential portions of films formed by dual magnetron type sputtering and single magnetron type sputtering, respectively.
Figure 4B:
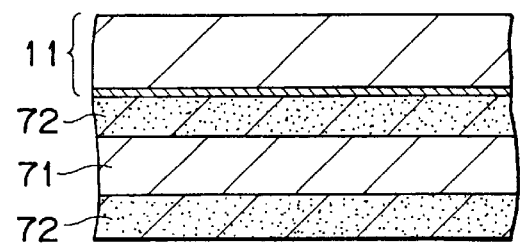

On the other hand, as shown in FIG. 3B, in the single magnetron type sputtering (of a type applying a dc voltage), sputtering is carried out by applying a dc voltage to a target 63 in a sputtering atmosphere composed of a mixed gas of argon gas and an oxygen gas. The silicon oxide film formed on the base film 11 by such single magnetron type sputtering exhibits a layer configuration shown in FIG. 4B, in which only one layer 71 containing oxygen in a small amount is put between two layers 72 each containing oxygen in a large amount.

Accordingly, the film formed by dual magnetron type sputtering is of a multilayer structure in which each layer is finely formed. In such a film, since strain is finely dispersed into the fine layers, the entire residual stress is relatively equally dispersed in the film, with a result that the film becomes strong against an external force. It is known to a person skilled in the metallic material technology that as compared with a single layer structure or a multilayer structure in which layers are coarsely stacked, a multilayer structure in which layers are finely stacked is effective to obstruct dispersion of stress or propagation of breakage at interfaces between fine layers, and consequently, such a multilayer structure is less susceptible to breakage as a whole.

Figure 5:
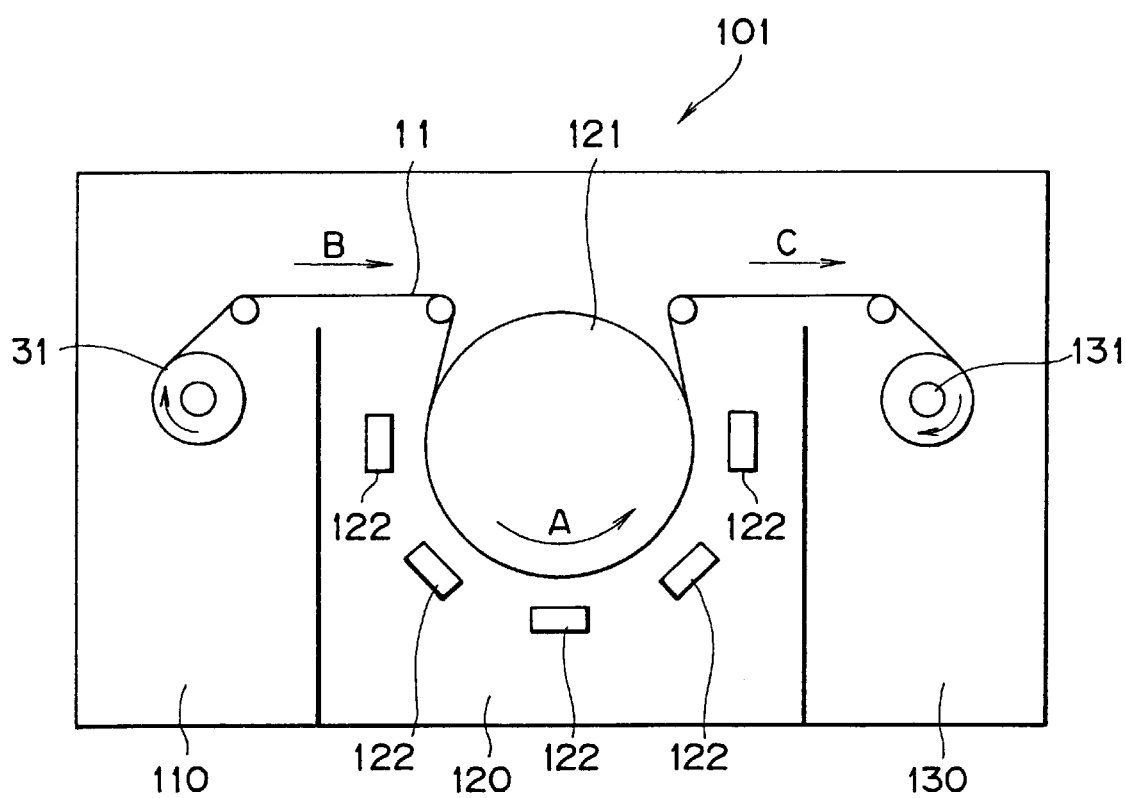
FIG. 5 is a schematic configuration view showing one example of a dual magnetron type sputtering system.

One example of the above dual magnetron type sputtering system will be described with reference to FIG. 5. As shown in FIG. 5, a dual magnetron type sputtering system 101 includes a rolled film feeding chamber 110, a sputtering chamber 120, and a rolled film winding chamber 130. The chambers are continuously arranged. The rolled film feeding chamber 110 contains a roll 31 of a base film 11. In the sputtering chamber 120 is provided a roller 121. By rotating the roller 121 in the direction A, the base film 11 fed from the rolled film feeding chamber 110 in the direction B is wound around part of the surface of the roller 121, and is then fed into the rolled film winding chamber 130 in the direction C. A plurality of cathodes 122 (equivalent to a set of the targets 61 in FIG. 3A) are arranged around the surface of the roller 121 in the turning direction in such a manner as to be separated a specific distance from the surface of the roller 121. In the rolled film winding chamber 130 is provided a winding roller 131 around which the base film 11 fed from the sputtering chamber 120 is wound.

In the sputtering system 101, during a period of time when the base film 11 fed from the rolled film feeding chamber 110 is wound around part of the surface of the roller 121 and is fed into the rolled film winding chamber 130, an alternating current is applied to the electrodes 122 to form sputter films on the base film 11. At this time, by changing the sputtering atmosphere, an $SiO_x$ film, $SiO_2$ films, and ITO films are formed, to thus form the antireflection film 20 described above.

Hereinafter, there will be described one inventive example in which an antireflection film is formed under the conditions specified in the above embodiment, and a comparative example in which an antireflection film is formed under the conditions according to the related art method. It should be noted that parts used in the inventive example, which correspond to those in the above embodiment, are designated by the same symbols as those in the above embodiment.

As a base film 11, a 188 μm thick PET film 12 was used on which a 5 μm thick hard coat film 13 was formed. An antireflection film 20 was formed on the hard coat film 13 under conditions shown in Table 1. In Table 1, films in the inventive example are sequentially listed in the order from the lowermost $SiO_x$ film 21 to the $SiO_2$ film 25; and similarly, films in the comparative example are sequentially listed in the order from the lowermost film to the uppermost film. The running speed of the base film 11 was set at 0.8 m/min. As the glow discharge conditions for sputtering, the vacuum degree was set at 0.4 Pa; the flow rate of argon (Ar) was set at 50 sccm; the voltage was set at 500 V; and the power was set at 0.1 kW. In the inventive example, aluminum was used as the electrode material in the sputtering system; and in the comparative example, a stainless steel (SUS304) was used as the electrode material.

TABLE 1

| Sputtering Condition | kinds of films | | | | |
|---|---|---|---|---|---|
| | $SiO_x$ | ITO | $SiO_2$ | ITO | $SiO_2$ |
| Inventive Example | | | | | |
| flow rate of mixed gas (sccm) | 100 | 150 | 200 | 150 | 200 |
| Ar:$O_2$ (volume ratio) | 5:1 | 2:1 | 1:1 | 2:1 | 1:1 |
| power (kW) × position number of target | 3 × 1 | 4.2 × 1 | 4.8 × 1 | 5.1 × 1 | 12.1 × 2 |
| Comparative Example | | | | | |
| flow rate of mixed gas (sccm) | 100 | 150 | 200 | 150 | 200 |
| Ar:$O_2$ (volume ratio) | 5:1 | 2:1 | 1:1 | 2:1 | 1:1 |

TABLE 1-continued

| Sputtering Condition | kinds of films | | | | |
|---|---|---|---|---|---|
| | $SiO_x$ | ITO | $SiO_2$ | ITO | $SiO_2$ |
| power (kW) × position number of target | 2 × 1 | 2 × 1 | 2 × 1 | 6 × 2 | 10 × 2 |

Figure 6A:
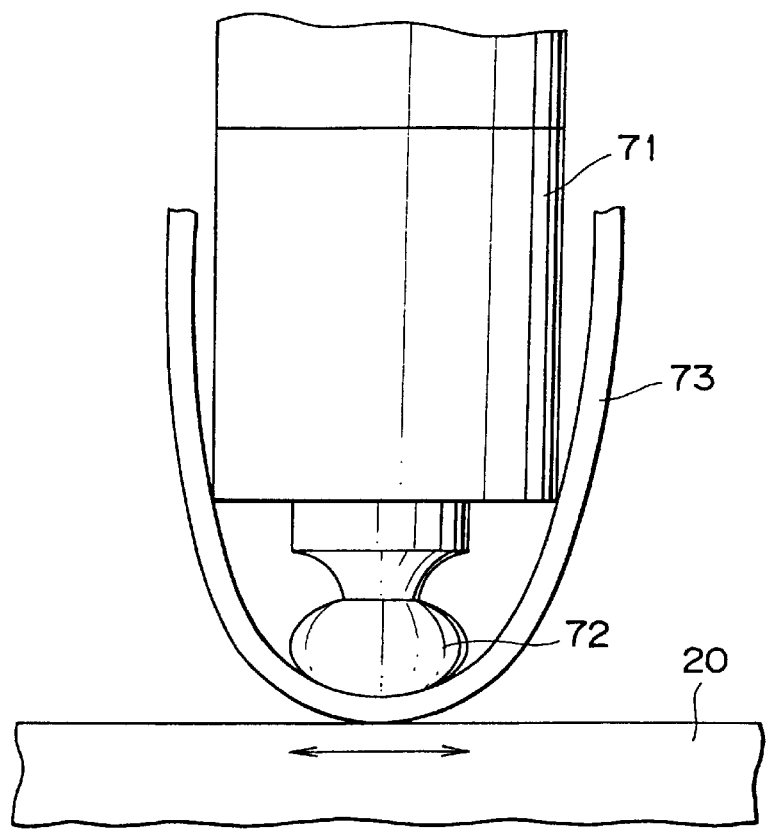
FIGS. 6A and 6B are views illustrating a loading/rubbing testing apparatus.
Figure 6B:
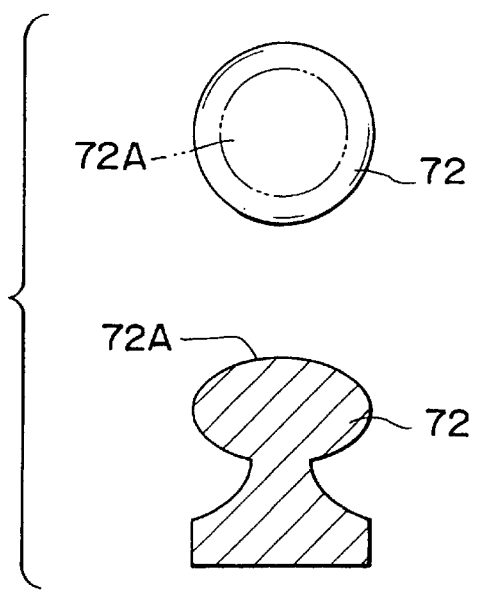

The light reflectance of the antireflection film in each of the inventive and comparative examples was 0.4% for light having a wavelength of 450 nm to 650 nm. The electric resistance in the inventive example was 250 Ω/□, and the electric resistance in the comparative example was 120 Ω/□. The total light transmittance in each of the inventive and comparative examples was 90%. Next, the adhesive strength of the antireflection film 20 repeatedly subjected to a high temperature/high humidity condition and repeatedly subjected to five cycles of heat history between +70° C. (five hours) and −40° C. (five hours) was subjected to a loading/rubbing test shown in FIG. 6A. As shown in FIG. 6A, a head 72 applied with a load 71 of 2 kg was pressed on the surface of the antireflection film 20 via four pieces of gauze 73 impregnated with ethylalcohol, and was reciprocatingly rubbed a specific distance of 10 cm in the direction shown by the arrow. The rubbing of the head 72 was repeated 20 times. As shown in FIG. 6B, the shape of the leading end of the head 72 is formed into a circular shape in plan view (diameter: 23.3 mm) [see the plan view of FIG. 6B] and into an elliptic shape in cross-section [major diameter: 23.3 mm, minor diameter: 10 mm) [see the sectional view of FIG. 6B]; and the diameter of an actual contact surface 72A is about 17 mm and the contact area is about 2.3 cm². As a result of the above test, in the inventive examples, no damage was observed on the surface of each sample; however, in the comparative example, damages were observed on the surfaces of 50 samples out of 100 samples. This means that the yield of the antireflection films in the inventive example is improved about twice that of the antireflection film in the comparative example.

Although in the above description the standard of the total light transmittance being 90% or more is adopted, the standard is suitably changed. However, if the standard is changed, the principle in which the allowance in manufacture of the antireflection film is extended according to the present invention can be applied to the standard thus changed. That is to say, when stuck on a glass panel of a CRT, the antireflection film generally requires a total light transmittance of 90% or more; however, if the above glass panel is made from a glass material enhanced in transmittance, the antireflection film may have a total light transmittance of about 80% or more. Accordingly, the antireflection film of the present invention may be manufactured under the standard of the total light transmittance determined depending on the transmittance of a glass panel of a CRT.

In addition, the total light transmittance of the base film composed of the PET (polyethylene terephthalate) film on which the hard coat film is formed is in a range of 92% to 94%, and accordingly, to obtain the total light transmittance of 90% or more of the entire antireflection film, a reduction in transmittance allowable for the sputter films constituting the entire antireflection film is in a range of about 2% to 5%.

While the preferred embodiment of the present invention has been described using specific terms, such description is for illustrative purposes only, and it is to be understood that changes and variations may be made without departing from the spirit or scope of the following claims.

What is claimed is:

1. An antireflection film, which comprises:
   a plurality of silicon oxide films and indium tin oxide films stacked on a base film in multilevels,
   wherein a lowermost silicon oxide film, positioned at an interface with said base film, of said antireflection film is a $SiO_x$ film where the value x is in a range of 0.5 to 1.9.

2. A method of manufacturing an antireflection film is in claim 1, comprising the step of:
   stacking silicon oxide films and indium tin oxide films on a base film in multilevels,
   wherein the thickness of an uppermost silicon oxide film of said antireflection film is thicker than an indium tin oxide film directly under said uppermost silicon oxide film.

3. A method of manufacturing an antireflection film according to claim 2, further comprising the step of forming a lowermost silicon oxide film of said antireflection film while controlling a degree of oxidation of silicon by measuring light absorption of said silicon oxide film.

4. A method of manufacturing an antireflection film according to claim 2, further comprising the step of allowing, before formation of a lowermost silicon oxide film, a surface of said base film on which said lowermost silicon oxide film is to be formed to undergo surface activation treatment due to glow discharge using an aluminum electrode.

5. A method of manufacturing an antireflection film according to claim 3, further comprising the step of allowing, before formation of the lowermost silicon oxide film, a surface of said base film on which said lowermost silicon oxide film is to be formed to undergo surface activation treatment due to glow discharge using an aluminum electrode.

6. A method of manufacturing an antireflection film according to claim 2, wherein said films constituting said antireflection film are formed using a dual magnetron type sputtering system.

7. A method of manufacturing an antireflection film according to claim 3, wherein said films constituting said antireflection film are formed using a dual magnetron type sputtering system.

8. A method of manufacturing an antireflection film according to claim 4, wherein said films constituting said antireflection film are formed using a dual magnetron type sputtering system.

9. A method of manufacturing an antireflection film according to claim 5, wherein said films constituting said antireflection film are formed using a dual magnetron type sputtering system.

10. An antireflection film as in claim 1, which comprises:
    silicon oxide films and indium tin oxide films stacked on a base film in multilevels; and
    a contamination preventive film, formed on the uppermost silicon oxide film,
    wherein a thickness of an uppermost silicon oxide film of said antireflection film is thicker than that of an indium tin oxide film directly under said uppermost silicon oxide film.

11. An antireflection film as set forth in claim 1 or 10, wherein said base film comprises:
    a PET film; and
    a coat film, formed on said PET film, which comprises polymethyl methacrylate.

* * * * *

UNITED STATES PATENT AND TRADEMARK OFFICE
CERTIFICATE OF CORRECTION

PATENT NO. : 6,284,382 B1
DATED : September 4, 2001
INVENTOR(S) : Hiroichi Ishikawa et al.

It is certified that error appears in the above-identified patent and that said Letters Patent is hereby corrected as shown below:

<u>Column 9, claim 2,</u>
Line 9, replace "is" with -- as --.

Signed and Sealed this

Second Day of April, 2002

Attest:

JAMES E. ROGAN
*Attesting Officer*   *Director of the United States Patent and Trademark Office*